United States Patent
Loinaz

(10) Patent No.: US 6,417,717 B1
(45) Date of Patent: Jul. 9, 2002

(54) HIERARCHICAL MULTIPLEXER FOR ANALOG ARRAY READOUT

(75) Inventor: Marc J. Loinaz, Westfield, NJ (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/223,874

(22) Filed: Dec. 31, 1998

(51) Int. Cl.[7] .............................................. H03K 17/62
(52) U.S. Cl. ...................................... 327/407; 327/99
(58) Field of Search ................................ 370/539, 541, 370/537, 535, 532, 533; 327/99, 403, 407–413, 310, 317, 318, 337

(56) References Cited

U.S. PATENT DOCUMENTS

| | | | | |
|---|---|---|---|---|
| 5,760,622 A | * | 6/1998 | Ishigaki ........................ | 327/113 |
| 5,864,561 A | * | 1/1999 | Becher ......................... | 327/407 |
| 6,064,242 A | * | 5/2000 | Yoshiba ........................ | 327/109 |
| 6,111,898 A | * | 8/2000 | Banik et al. .................. | 327/408 |

OTHER PUBLICATIONS

Willem Hoekstra et al., "A memory read–out approach for a 0.5 m CMOS image sensor", Proceedings of the SPIE, vol. 3301, pp. 151–157 Apr. 1998.
Motorola, "1/4" Color CIF Image Sensor (A Series), Motorola Semi–conductor Technical Data, pp. 1–24, 1998.
M. Loinaz et al., "FA 11.1: A 200mW 3.3V CMOS Color Camera IC Producing 352×288 24b Video at 30Frames/s", 1998 Isscc Digest of Technical Papers, pp. 168–169.
J.E.D. Hurwitz et al., "An 800K–Pixel Color CMOS Sensor For Consumer Still Camera", Proceedings of the SPIE, vol. 3019, pp. 115–124, Apr. 1997.
Chye Huat Aw et al., "A 128 ×128–Pixel Standard–CMOS Image Sensor with Electronic Shutter", IEEE Journal Of Solid State Circuits, vol. 31, No. 12, Dec. 1996, pp. 1922–1930.
Alex Dickinson et al., "TP 13.5: A 256×256 CMOS Active Pixel Image Sensor with Motion Detection", ISSCC Digest of Technical Papers, pp. 226–227, Feb. 1995.
N. Weste et al. Principles of CMOS VLSI Design, Addison-Wesley, pp. 360–361, 1985.

* cited by examiner

Primary Examiner—My-Trang Nu Ton

(57) ABSTRACT

A unique hierarchical multiplexer is employed to multiplex signals read out from analog array elements one at a time to an output. In an embodiment of the invention, the multiplexer switching elements, i.e., switches, are arranged in groups in a hierarchical, i.e., tree, configuration. In the tree configuration for a given analog array size, output capacitance is significantly reduced because each analog array element and its associated buffer amplifier drive fewer switches than in other configurations. The lower capacitance reduces any resulting FPN and the resulting lower analog array element and buffer amplifier drive current reduces power dissipation. The reduced capacitance also decreases the transient settling time interval. In one embodiment of the invention, a hierarchical multiplexer employed in reading out signals from elements of an analog array is optimized to produce low FPN by employing unity gain buffer amplifiers which are associated on a one-to-one basis with the analog array elements; using offset correction to compensate for nonuniformity of offset voltages or currents among the buffer amplifiers; not allowing direct current (DC) to flow in switches utilized in the multiplexer; and allowing all transients to settle prior to reading out signals from the analog array elements. In a specific embodiment of the invention, the offset compensation is effected for signals being read out from each element of the analog array by sampling and storing a first value representative of a "regular" output from the multiplexer that is associated with a particular array element and its associated buffer amplifier, sampling and storing a second value representative of a reference output, i.e., an output from the multiplexer resulting from a reference potential being supplied to the buffer amplifier input associated with the particular analog array element, and subtracting the second value from the first value to yield an offset compensated output.

53 Claims, 2 Drawing Sheets

100

US 6,417,717 B1

HIERARCHICAL MULTIPLEXER FOR ANALOG ARRAY READOUT

TECHNICAL FIELD

This invention relates to analog readout arrangements and, more particularly, to a hierarchical multiplexer.

BACKGROUND OF THE INVENTION

The reading out of signals from an analog array element typically is done in serial fashion. Consequently, it is necessary to multiplex signals resulting from the analog array elements one at a time to an output.

Known multiplexers that have been employed in the readout of digital data are the hierarchical multiplexer and the logic decoder type multiplexer. However, in reading out of signals from analog array elements, it is known that use of a hierarchical multiplexer produces so-called fixed pattern noise (FPN). This is undesirable because, for example, in imaging arrays, the resulting FPN from the hierarchical multiplexer causes undesirable streaks in any resulting image. Therefore, logic decoder type multiplexers typically have been employed in multiplexing of signals read out from the analog array elements to an output.

Although the use of the logic decoder type multiplexer may result in less FPN, the logic decoder type multiplexer has other undesirable characteristics. For example, in order to reduce any resulting FPN, each buffer associated with a corresponding element in the analog array must drive the same amount of capacitance, which could become quite large. Since each analog array element and its associated buffer amplifier drive a relatively large capacitance, the resulting amount of drive current is also relatively large. This results in significantly larger power dissipation for the overall analog array, which is extremely undesirable.

SUMMARY OF THE INVENTION

These and other problems and limitations of prior known multiplexers for reading out signals from analog array elements are overcome by employing a unique hierarchical multiplexer to multiplex signals read out from the analog array elements one at a time to an output.

In an embodiment of the invention, the multiplexer switching elements, i.e., switches, are arranged in groups in a hierarchical, i.e., tree, configuration. In the tree configuration for a given analog array size, output capacitance is significantly reduced because each analog array element and its associated buffer amplifier drive fewer switches than in other configurations. The lower capacitance reduces any resulting FPN and the resulting lower analog array element and buffer amplifier drive current reduces power dissipation. The reduced capacitance also decreases the transient settling time interval.

In one embodiment of the invention, a hierarchical multiplexer employed in reading out signals from elements of an analog array is optimized to produce low FPN by employing unity gain buffer amplifiers which are associated on a one-to-one basis with the analog array elements; using offset correction to compensate for nonuniformity of offset voltages or currents among the buffer amplifiers; not allowing direct current (DC) to flow in switches utilized in the multiplexer; and allowing all transients to settle prior to reading out signals from the analog array elements.

In a specific embodiment of the invention, the offset compensation is effected for signals being read out from each element of the analog array by sampling and storing a first value representative of a "regular" output from the multiplexer that is associated with a particular array element and its associated buffer amplifier, sampling and storing a second value representative of a reference output, i.e., an output from the multiplexer resulting from a reference potential being supplied to the buffer amplifier input associated with the particular analog array element, and subtracting the second value from the first value to yield an offset compensated output.

DETAILED DESCRIPTION

Figure 1:
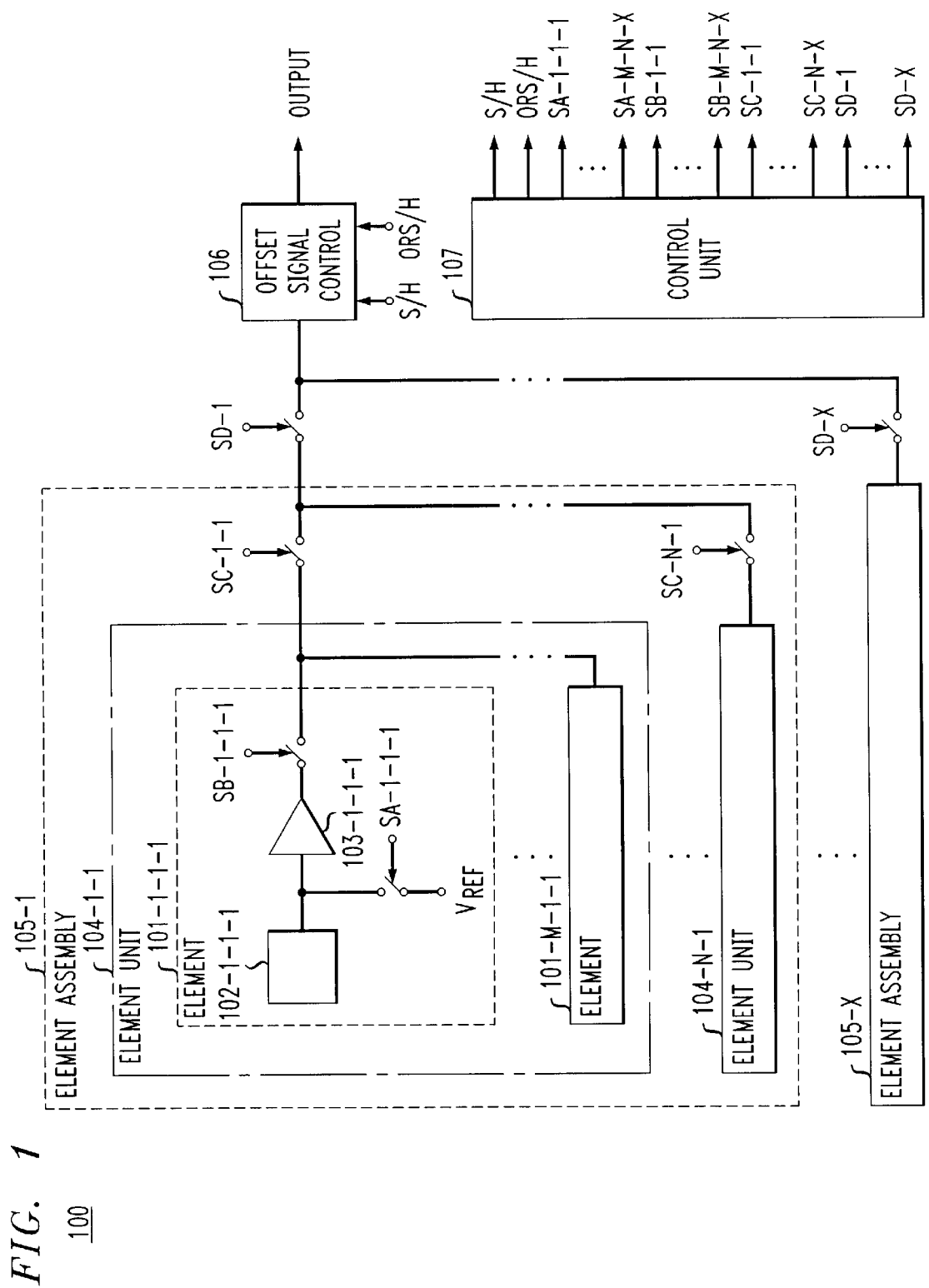
FIG. 1 shows, in simplified form, details of an analog array readout employing a hierarchical multiplexer in accordance with an embodiment of the invention.

FIG. 1 shows, in simplified form, details of analog array readout 100 employing a hierarchical multiplexer, in accordance with the invention. At the outset, it should be noted that, in this example, a hierarchy of three (3) levels, i.e., sets, of multiplexer switches is employed, however, any number of levels may be employed, as the implementer desires. Additionally, the element units 104 are shown as each having an equal number of elements 101 in a group and each element assembly 105 is shown as having an equal number of element units 104 in a group. In practice, these numbers may not necessarily be equal from element unit to element unit and/or element assembly to element assembly. However, for simplicity and clarity of exposition a uniform number of elements in each of the element units and a uniform number of element units in each of the element assemblies are shown and described here. Moreover, it is noted that only one column of the analog array is shown. It will be apparent to those skilled in the art that an analog array may include any desired number of columns and that the individual columns may be significantly long, i.e., have a large number of analog array elements, depending on a particular application.

Specifically, shown in FIG. 1 is analog array readout element 101-1-1-1, which includes analog array element 102-1-1-1 and buffer amplifier 103-1-1-1. Analog array element 102-1-1-1 may be, for example, a sensor in an image sensing array of a type well known in the art. Buffer amplifier 103-1-1-1 is a unity gain feedback amplifier, which is employed toward minimizing any FPN. This is realized because use of such unity gain feedback amplifiers 103 results in gain uniformity in each multiplexer output path. The gain of such an amplifier is:

$$\text{gain} = \frac{A_0}{1 + A_0}$$

Note that variations in $A_0$ for different ones of buffer amplifiers 103 will have only a small effect on the "gain" and therefore will produce only minimal FPN.

However, the use of a buffer amplifier 103 in conjunction with each analog array element 102 will produce FPN if the input offset voltages or currents of buffer amplifiers 103 are nonuniform. Then, it is important to provide compensation for offset mismatch among the individual ones of buffer amplifiers 103. To this end, reference potential VREF is controllably connectable via switch SA-1-1-1 to the input of buffer amplifier 103-1-1-1 (FIG. 1) during the offset compensation process, as described below in relationship to FIG. 2. Multiplexer switch SB-1-1-1 is used to controllably connect the output of buffer amplifier 103-1-1-1 as an output of element 101-1-1-1 and forms with buffer amplifier 103-1-1-1 a controllable analog array readout element. Multiplexer switch SB-1-1-1 is in the first multiplexer level, i.e., set, of the hierarchical multiplexer and controllably supplies the output of buffer amplifier 103-1-1-1 as an output of element 101-1-1-1 and, then, to multiplexer switch SC-1-1.

Elements 101-1-1-1 through 101-M-1-1 form element unit, i.e., set, 104-1-1. Outputs of the buffer amplifiers 103-1-1-1 through 103-M-1-1 (not shown) in each of elements 101-1-1-1 through 101-M-1-1, respectively, are controllably supplied via multiplexer switches SB-1-1-1 through SB-M-1-1 (not shown), respectively, one at a time to multiplexer switch SC-1-1. Multiplexer switches SB-1-1-1 through SB-M-1-1 are in the first level of the hierarchical multiplexer and switch SC-1-1 is in a second level, i.e., set, in the hierarchical multiplexer. In this example, "M" is the number of elements 101 in an element unit 104.

Element units 104-1-1 through 104-N-1 form element assembly, i.e., controllable analog readout element group, 105-1 and supply outputs from the buffer amplifiers 103 in each of the elements 101 therein one at a time via appropriate first level hierarchical multiplexer switches SB and second level hierarchical multiplexer switches SC-1-1 through SC-N-1, respectively, to multiplexer switch SD-1-1. Again, multiplexer switches SC-1-1 through SC-N-1 are in the second level in the hierarchical multiplexer and multiplexer switch SD-1 is in a third level, i.e., set, in the hierarchical multiplexer. In this example, "N" is the number of element units 104 in an element assembly 105.

Element assemblies 105-1 through 105-X controllably supply the outputs from elements 101 therein via selected ones of hierarchical multiplexer switches SB and SC via multiplexer switches SD-1 through SD-X, respectively, one at a time to offset signal control 106. In this example, "X" is the number of element assembly units 105.

As noted above, the switches of the hierarchical multiplexer are arranged in groups in a tree configuration, which advantageously, significantly reduces output capacitance. This results because in the tree configuration, each analog array element 102 and its associated buffer amplifier 103 drive fewer switches than in other analog array readout configurations. By way of an example, the number of switches being driven by an analog array element 102 and its associated buffer amplifier 103 in a tree configuration is on the order of "log N" instead of "N" for other configurations. An additional advantage of the tree configuration is that for a given size analog array there is significantly less output capacitance which, in turn, reduces power dissipation.

Figure 2:
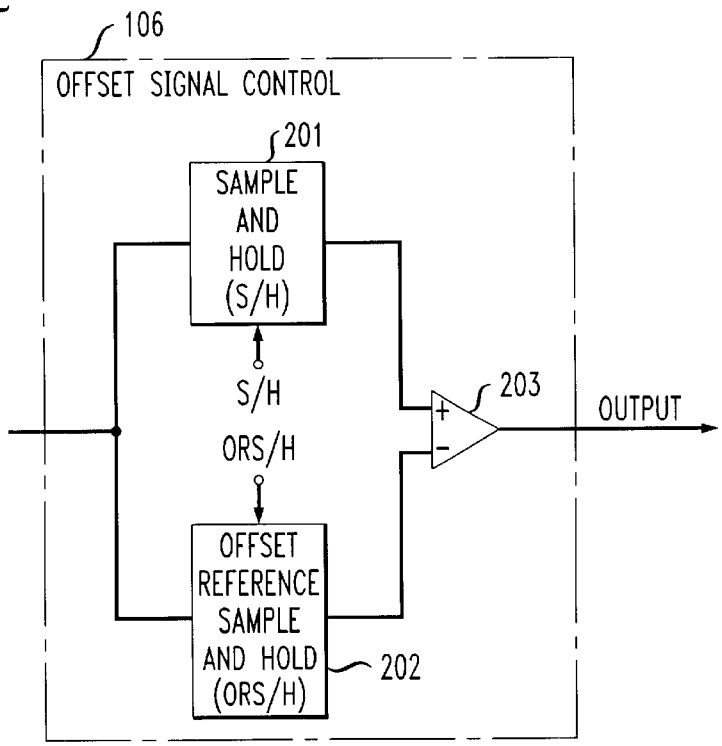
FIG. 2 shows, in simplified form, details of an example offset signal control that may be employed in the embodiment of FIG. 1.

Offset signal control 106 compensates for nonuniformity in the offset voltages or currents of buffer amplifiers 103. One arrangement for realizing offset compensation is shown in FIG. 2 and described below.

Figure 3:
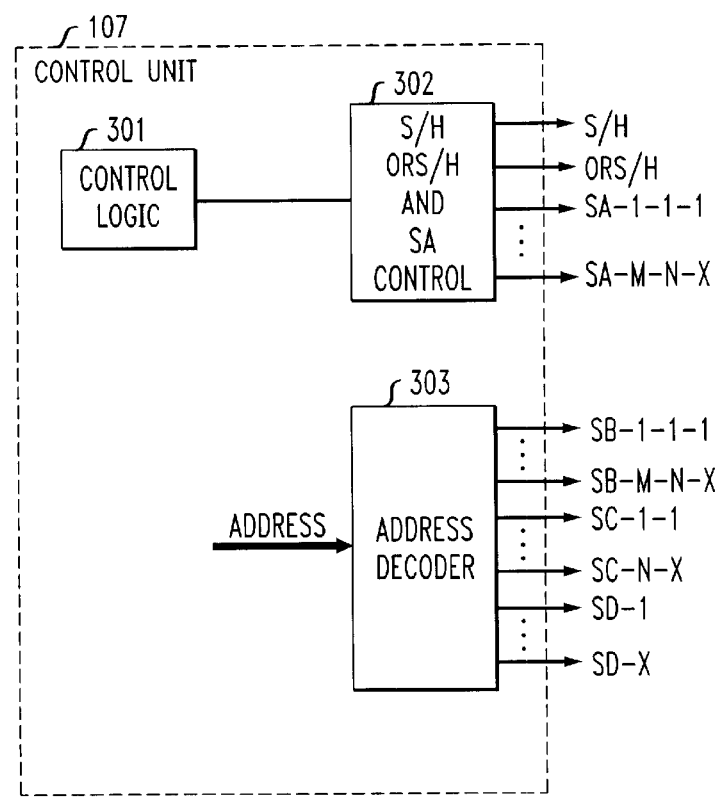
FIG. 3 shows, in simplified form, details of an example control unit that may be employed in the embodiment of FIG. 1.

Control signals for controlling offset signal control 106 and switches SA, SB, SC and SD are generated in control unit 107. One arrangement for generating the desired control signals is shown in FIG. 3 and described below.

Note that none of the outputs from analog array elements 102 are supplied as an output of the hierarchical multiplexer until all transients have settled. The settling interval is determined by the values of the parasitic capacitance and resistance in the signal paths of the hierarchical multiplexer, in well known fashion. The settling interval is obtained by not, i.e., inhibiting, sampling or otherwise reading the output of the hierarchical multiplexer for the desired time interval for both a so-called "regular" output and a "reference" output for each analog array element 102.

Additionally, no direct currents (DC) flow in any of the hierarchical multiplexer switches SB, SC, and SD. This is because the hierarchical multiplexer load, in this example, is capacitive. That is, there is no load resistance at the output of the hierarchical multiplexer. This is true for, for example, in CMOS implementations. It will be apparent to those skilled in the art how to realize no DC flow in the multiplexer switches in other implementations, for example, by employing capacitive coupling of signals or the like.

Because of the above considerations, the hierarchical multiplexer is optimal in terms of FPN. Moreover, since the hierarchical multiplexer switches SB, SC and SD are arranged in a hierarchical manner power dissipation is also optimal. Indeed, this results in the power dissipation being minimized because the capacitance load being driven by each of the analog array elements 102 and their associated buffer amplifiers 103 is minimized.

FIG. 2 shows, in simplified form, details of one arrangement that may be employed for offset signal control 106 of FIG. 1. Output signals form the hierarchical multiplexer are controllably supplied via hierarchical multiplexer switches SD-1 through SD-X to circuit path 200 and, then, to sample and hold (S/H) 201 and offset reference sample and hold (ORS/H) 202. Specifically, a so-called "regular" output signal from an analog array element 102 (FIG. 1, switch SA open) and its associated buffer amplifier 103 is sampled and stored in S/H 201. Then, an offset reference signal from the associated buffer amplifier 103 (switch SA closed to supply VREF to an input of the buffer amplifier 103) is sampled and stored by ORS/H 202. The output from S/H 201, which represents a first value, is supplied to a positive input of differential amplifier 203 and the output from ORS/H 202, which represents a second value, is supplied to a negative input of differential amplifier 203. Differential amplifier 203 algebraically subtracts the second output value of ORS/H 202 from the first output value of S/H 201 to yield an offset compensated output signal. In this example, this procedure is effected for each output being read from the analog elements 102. It will be apparent that if enough memory is available, that the offset reference signals need only be sampled once for each of the buffer amplifiers 103 and, then, stored for use with each new signal readout from an analog array element 102 by its associate buffer amplifier 103.

FIG. 3 shows, in simplified form, details of control unit 107 of FIG. 1. Control unit 107 includes control logic 301 for controlling unit 302 to generate control signals S/H and ORS/H for sample and hold 201 (FIG. 2) and offset reference sample and hold 202, respectively, and control signals SA-1-1-1 through SA-M-N-X for controlling reference potential (VREF) switches SA. Address decoder 303 is responsive to supplied addresses to generate control signals SB-1-1-1 through SB-M-N-X, SC-1-1 through SC-N-X and SD-1 through SD-X for controlling hierarchical switches SB, SC and SD to supply the read out signals from the analog array elements 102 (FIG. 1) in a hierarchical fashion as an output of hierarchical multiplexer 100.

What is claimed is:
1. A multiplexer for use in reading out signals from an analog array including a plurality of analog array elements comprising:
    a plurality of buffer amplifiers, each having an input, an output and a prescribed amplifier gain, and being arranged to receive an analog array element signal from an associated one of the plurality of analog array elements and to supply a buffer amplified version of said analog array element signal at its output;

a plurality of controllable switching elements, each having an input and an output, inputs of a first plurality of said plurality of controllable switching elements being associated on a one-to-one basis with said outputs of said buffer amplifiers, each buffer amplifier and its associated controllable switching element forming a controllable analog array readout element, said output of said controllable switching element being an output of said controllable analog array readout element;

at least a first plurality of sets of said controllable analog array readout elements, each set having a prescribed number of said controllable analog array readout elements, outputs from said number of controllable analog array readout elements being connected in circuit relationship to form an output of said set;

at least a second plurality of said plurality of said controllable switching elements, outputs of said first plurality of sets being associated on a one-to-one basis with inputs of said second plurality of controllable switching elements forming at least a first controllable analog array readout element group, outputs of said second plurality of controllable switching elements in said group being connected in circuit relationship to form an output of said group; and a controller for controlling said first plurality of controllable switching elements and said at least second plurality of controllable switching elements to supply outputs from said plurality of buffer amplifiers one at a time as an output from said at least first controllable analog array readout element group, whereby any resulting fixed pattern noise and power dissipation are optimally minimized.

2. The invention as defined in claim 1 further including a plurality of said controllable analog array readout element groups, outputs of said plurality of controllable analog array readout element groups being associated on a one-to one basis with inputs of at least a third plurality of said controllable switching elements, outputs of said at least third plurality of controllable switching elements being connected in circuit relationship as an output of said multiplexer and wherein said controller controls said controllable switching elements to supply outputs from said buffer amplifiers one at a time as an output from said multiplexer output.

3. The invention as defined in claim 2 further including a source of a reference potential, and a fourth plurality of controllable switching elements associated on a one-to-one basis to said inputs of said plurality of buffer amplifiers and being arranged to controllably supply said reference potential to said inputs of said buffer amplifiers, and offset signal control unit for utilizing a reference potential output from said multiplexer for each of said plurality of buffer amplifiers to compensate an analog array element output from said multiplexer output to compensate for offset for each of corresponding ones said plurality of buffer amplifiers and wherein said controller controllably supplies said reference potential to said inputs of said buffer amplifiers via said fourth plurality of controllable switching elements one at a time.

4. The invention as defined in claim 3 wherein said offset signal control unit includes a reference signal sample and hold unit for sampling and storing a reference output from said multiplexer when said reference potential is supplied to a particular one of said plurality of buffer amplifier, an analog array signal sample and hold unit for sampling and storing an array element output from said multiplexer when an analog array element signal is supplied to said particular one of said plurality of buffer amplifiers and a difference circuit for algebraically subtracting said stored reference output from said stored analog array element output to yield a offset compensated version of said multiplexer output and wherein said controller controls said sampling and hold units to sample and store said reference outputs and said analog array element outputs for said plurality of buffer amplifiers one at a time.

5. The invention as defined in claim 4 wherein said controller inhibits each of said sample and hold units from sampling and storing said reference outputs and said analog array element outputs each for a prescribed interval for each of said plurality of buffer amplifiers so that transients are substantially settled prior to sampling said multiplexer output.

6. The invention as defined in claim 2 wherein each of said buffer amplifiers is a unity gain amplifier.

7. The invention as defined in claim 6 wherein the gain of each of said plurality of buffer amplifiers is $$\text{gain} = \frac{A_0}{1 + A_0},$$

where $A_0$ is the open loop gain of the individual ones of said plurality of buffer amplifiers.

8. The invention as defined in claim 2 wherein said multiplexer load impedance is a capacitance, whereby no direct current flows through said first, second and third pluralities of controllable switching elements.

9. The invention as defined in claim 8 wherein said first, second and third pluralities of controllable switching elements are arranged in a hierarchical configuration.

10. The invention as defined in claim 9 wherein said hierarchical configuration is a tree configuration.

11. The invention as defined in claim 9 wherein said capacitance load is substantially reduced thereby significantly reducing transient settling time.

12. The invention as defined in claim 9 wherein said capacitance load is substantially reduced thereby significantly reducing transient power dissipation.

13. The invention as defined in claim 2 wherein said plurality of analog array elements is arranged in a column.

14. An analog array readout apparatus comprising:
a plurality of analog array elements;
a multiplexer including
a plurality of buffer amplifiers, each having an input, an output and a prescribed amplifier gain, and being arranged to receive an analog array element signal from an associated one of the plurality of analog array elements and to supply a buffer amplified version of said analog array element signal at its output;
a plurality of controllable switching elements, each having an input and an output, inputs of a first plurality of said plurality of controllable switching elements being associated on a one-to-one basis with said outputs of said buffer amplifiers, each buffer amplifier and its associated controllable switching element forming a controllable analog array readout element, said output of said controllable switching element being an output of said controllable analog array readout element;
at least, a first plurality of sets of said controllable analog array readout elements, each set having a prescribed number of said controllable analog array readout elements, outputs from said number of controllable analog array readout elements being connected in circuit relationship to form an output of said set;

at least a second plurality of said plurality of said controllable switching elements, outputs of said first plurality of sets being associated on a one-to-one basis with inputs of said second plurality of controllable switching elements forming at least a first controllable analog array readout element group, outputs of said second plurality of controllable switching elements in said group being connected in circuit relationship to form an output of said group; and a controller for controlling said first plurality of controllable switching elements and said at least second plurality of controllable switching elements to supply outputs from said plurality of buffer amplifiers one at a time as an output from said at least first controllable analog array readout element group, whereby any resulting fixed pattern noise and power dissipation are optimally minimized.

15. The invention as defined in claim 14 further including a plurality of said controllable analog array readout element groups, outputs of said plurality of controllable analog array readout element groups being associated on a one-to one basis with inputs of at least a third plurality of said controllable switching elements, outputs of said at least third plurality of controllable switching elements being connected in circuit relationship as an output of said multiplexer and wherein said controller controls said controllable switching elements to supply outputs from said buffer amplifiers one at a time as an output from said multiplexer output.

16. The invention as defined in claim 15 further including a source of a reference potential, and a fourth plurality of controllable switching elements associated on a one-to-one basis to said inputs of said plurality of buffer amplifiers and being arranged to controllably supply said reference potential to said inputs of said buffer amplifiers, and a offset signal control unit for utilizing a reference potential output from said multiplexer for each of said plurality of buffer amplifiers to compensate an analog array element output from said multiplexer output to compensate for offset for each of corresponding ones said plurality of buffer amplifiers and wherein said controller controllably supplies said reference potential to said inputs of said buffer amplifiers via said fourth plurality of controllable switching elements one at a time.

17. The invention as defined in claim 16 wherein said offset signal control unit includes a reference signal sample and hold unit for sampling and storing a reference output from said multiplexer when said reference potential is supplied to a particular one of said plurality of buffer amplifier, an analog array signal sample and hold unit for sampling and storing an array element output from said multiplexer when an analog array element signal is supplied to said particular one of said plurality of buffer amplifiers and a difference circuit for algebraically subtracting said stored reference output from said stored analog array element output to yield a offset compensated version of said multiplexer output and wherein said controller controls said sampling and hold units to sample and store said reference outputs and said analog array element outputs for said plurality of buffer amplifiers one at a time.

18. The invention as defined in claim 17 wherein said controller inhibits each of said sample and hold units from sampling and storing said reference outputs and said analog array element outputs each for a prescribed interval for each of said plurality of buffer amplifiers so that transients are substantially settled prior to sampling said multiplexer output.

19. The invention as defined in claim 15 wherein each of said buffer amplifiers is a unity gain amplifier.

20. The invention as defined in claim 19 wherein the gain of each of said plurality of buffer amplifiers is $$\text{gain} = \frac{A_0}{1 + A_0},$$

where $A_0$ is the open loop gain of the individual ones of said plurality of buffer amplifiers.

21. The invention as defined in claim 15 wherein said multiplexer load impedance is a capacitance, whereby no direct current flows through said first, second and third pluralities of controllable switching elements.

22. The invention as defined in claim 21 wherein said first, second and third pluralities of controllable switching elements are in a hierarchical configuration.

23. The invention as defined in claim 22 wherein said hierarchical configuration is a tree configuration.

24. The invention as defined in claim 22 wherein said capacitance load is substantially reduced thereby significantly reducing transient settling time.

25. The invention as defined in claim 22 wherein said capacitance load is substantially reduced thereby significantly reducing power dissipation.

26. The invention as defined in claim 15 wherein said plurality of analog array elements is arranged in a column.

27. The invention as defined in claim 26 wherein said analog array includes a plurality of columns of said analog array elements and further including a plurality of said multiplexers associated on a one-to-one basis with said plurality of columns.

28. A multiplexer for use in reading out signals from an analog array including a plurality of analog array elements comprising:

a plurality of means for amplifying, each having an input, an output and a prescribed amplifier gain, and being arranged to receive an analog array element signal from an associated one of the plurality of analog array elements and to supply an amplified version of said analog array element signal at its output;

a plurality of means for controllably switching, each having an input and an output, inputs of a first plurality of said plurality of means for controllably switching being associated on a one-to-one basis with said outputs of said mean for amplifying, each mans for amplifying and its associated means for controllably switching forming a controllable analog array readout element, said output of said mans for controllably switching being an output of said controllable analog array readout element;

at least a first plurality of sets of said controllable analog array readout elements, each set having a prescribed number of said controllable analog array readout elements, outputs from said number of controllable analog array readout elements being connected in circuit relationship to form an output of said set;

at least a second plurality of said plurality of said means for controllably switching, outputs of said first plurality of sets being associated on a one-to-one basis with inputs of said second plurality of means for controllably switching forming at least a first controllable analog array readout element group, outputs of said second plurality of means for controllably switching in said group being connected in circuit relationship to form an output of said group; and means for controlling said first plurality of means for controllably switching and said at least second plurality of means for controllably switching to supply outputs from said plurality of means for amplifying one at a time as an output from said at least first controllable analog array readout element group, whereby any resulting fixed pattern noise and power dissipation are optimally minimized.

29. The invention as defined in claim 28 further including a plurality of said controllable analog array readout element groups, outputs of said plurality of controllable analog array readout element groups being associated on a one-to one basis with inputs of at least a third plurality of said means for controllably switching, outputs of said at least third plurality of means for controllably switching being connected in circuit relationship as an output of said multiplexer and wherein said means for controlling controls said plurality of means for controllably switching to supply outputs from said plurality of means for amplifying one at a time as an output from said multiplexer output.

30. The invention as defined in claim 29 further including a source of a reference potential, and a fourth plurality of means for controllably switching associated on a one-to-one basis to said inputs of said plurality of means for amplifying and being arranged to controllably supply said reference potential to said inputs of said plurality of means for amplifying, and means for utilizing a reference potential output from said multiplexer for each of said plurality of means for amplifying to compensate an analog array element output from said multiplexer output to compensate for a offset for each of corresponding ones said plurality of means for amplifying and wherein said means for controlling controllably supplies said reference potential to said inputs of said plurality of means for amplifying via said fourth plurality of means for controllably switching one at a time.

31. The invention as defined in claim 30 wherein said means for utilizing includes means for sampling and storing a reference output from said multiplexer when said reference potential is supplied to a particular one of said plurality of means for amplifying, means for sampling and storing an array element output from said multiplexer when an analog array element signal is supplied to said particular one of said plurality of means for amplifying and means for algebraically subtracting said stored reference output from said stored analog array element output to yield a offset compensated version of said multiplexer output and wherein said means for controlling controls said means for sampling and holding to sample and store said reference outputs and said analog array element outputs, respectively, for said plurality of means for amplifying one at a time.

32. The invention as defined in claim 31 wherein said means for controlling inhibits each of said means for sampling and holding from sampling and storing said reference outputs and said analog array element outputs, each for a prescribed interval for each of said plurality of means for amplifying so that transients are substantially settled prior to sampling said multiplexer output.

33. The invention as defined in claim 29 wherein each of said means for amplifying is a unity gain amplifier.

34. The invention as defined in claim 33 wherein the gain of each of said plurality of means for amplifying is $$\text{gain} = \frac{A_0}{1 + A_0},$$

where $A_0$ is the open loop gain of the individual ones of said plurality of means for amplifying.

35. The invention as defined in claim 29 wherein said multiplexer load impedance is a capacitance, whereby no direct current flows through said first, second and third pluralities of means for controllably switching.

36. The invention as defined in claim 35 wherein said first, second and third pluralities of means for controllably switching are arranged in a hierarchical configuration.

37. The invention as defined in claim 36 wherein said hierarchical configuration is a tree configuration.

38. The invention as defined in claim 36 wherein said capacitance load is substantially reduced thereby significantly reducing transient settling time.

39. The invention as defined in claim 36 wherein said capacitance load is substantially reduced thereby significantly reducing power dissipation.

40. The invention as defined in claim 29 wherein said plurality of analog array elements is arranged in a column.

41. A method for multiplexing for use in reading out signals from an analog array including a plurality of analog array elements, the method of multiplexing comprising the steps of:

amplifying analog array element signals from the plurality of analog array elements to supply an amplified version of said analog array element signal;

controllably switching said amplified versions of said analog array element signals;

at least a first plurality of sets of said controllably switched amplified versions of said analog array element signals, each set having a prescribed number of said controllably switched amplified versions of said analog array signals, said controllably switched amplified versions of said analog array element signals being supplied one at a time as an output of said first plurality of sets;

controllably switching said outputs of said first plurality of sets in such a manner that they are formed in at least a first controllable analog array readout element group and said outputs of said first plurality of sets being supplied as an output of said group; and said controllably switching being controlled to supply said plurality of amplified versions of said analog array element signals one at a time as an output from said at least first controllable analog array readout element group, whereby any resulting fixed pattern noise and power dissipation are optimally minimized.

42. The method as defined in claim 41 further including the step of controllably switching outputs from a plurality of said controllable analog array readout element groups one at a time as a multiplexed output.

43. The method as defined in claim 42 further including the step of controllably supplying a reference potential to be amplified for supplying an amplified version of said reference potential as an output.

44. The method as defined in claim 43 further including the steps of sampling and storing a reference output when said reference potential is supplied to be amplified, sampling and storing an array element output when an analog array element signal is supplied to amplified and algebraically subtracting said stored reference output from said stored analog array element output to yield a offset compensated version of said output one at a time.

45. The method as defined in claim 44 further including the step of inhibiting sampling and storing said reference outputs and said analog array element outputs, each for a prescribed interval so that transients are substantially settled prior to sampling said output.

46. The method as defined in claim 42 wherein said step of amplifying includes amplifying by a unity gain.

47. The method as defined in claim 41 wherein the gain is $$\text{gain} = \frac{A_0}{1 + A_0},$$

where $A_0$ is an open loop gain used in said step of amplifying.

48. The method as defined in claim 42 wherein a load impedance of said multiplexing is a capacitance, whereby no direct current flows in said steps of controllably switching.

49. The method as defined in claim 48 wherein said steps of controllably switching are arranged in a hierarchical configuration.

50. The method as defined in claim 49 wherein said hierarchical configuration is a tree configuration.

51. The method as defined in claim 49 wherein said capacitance load is substantially reduced thereby significantly reducing transient settling time.

52. The method as defined in claim 49 wherein said capacitance load is substantially reduced thereby significantly reducing power dissipation.

53. The method as defined in claim 42 wherein said plurality of analog array elements is arranged in a column.

* * * * *